(12) United States Patent  
Michalko et al.

(10) Patent No.: US 9,772,349 B1  
(45) Date of Patent: *Sep. 26, 2017

(54) CIRCUIT BOARD TESTING DEVICE FOR UNEVEN CIRCUIT BOARDS

(71) Applicant: Circuit Check, Inc., Maple Grove, MN (US)

(72) Inventors: Gregory J. Michalko, Maple Grove, MN (US); Stuart K. Eickhoff, Maple Grove, MN (US); Jon A. Hample, Maple Grove, MN (US); Russell G. Carter, Maple Grove, MN (US)

(73) Assignee: Circuit Check, Inc., Maple Grove, MN (US)

( * ) Notice: Subject to any disclaimer, the term of this patent is extended or adjusted under 35 U.S.C. 154(b) by 247 days.

This patent is subject to a terminal disclaimer.

(21) Appl. No.: 14/496,630

(22) Filed: Sep. 25, 2014

Related U.S. Application Data

(63) Continuation of application No. 13/452,220, filed on Apr. 20, 2012, now Pat. No. 8,847,618.

(51) Int. Cl.  
*G01R 31/00* (2006.01)  
*G01R 1/067* (2006.01)  
*G01R 31/28* (2006.01)

(52) U.S. Cl.  
CPC ..... *G01R 1/06705* (2013.01); *G01R 31/2818* (2013.01)

(58) Field of Classification Search  
CPC G01R 31/2808; G01R 1/07314; G01R 31/02; G01R 31/304; G01R 31/20; G01R 31/00; G01R 1/067; G01R 1/06705; G01R 31/28; G01R 31/2818  
See application file for complete search history.

(56) References Cited

U.S. PATENT DOCUMENTS

| | | | |
|---|---|---|---|
| 5,572,144 A | * | 11/1996 | Davidson ........... G01R 1/07314 324/750.19 |
| 7,200,509 B2 | | 4/2007 | Adams |
| 7,592,796 B2 | | 9/2009 | Staggert |
| 7,695,766 B2 | | 4/2010 | Adams |
| 7,749,566 B2 | | 7/2010 | Staggert |
| 7,852,096 B2 | | 12/2010 | Eickhoff |
| 8,004,300 B2 | | 8/2011 | Fossum et al. |
| 8,847,618 B1 | * | 9/2014 | Michalko ........... G01R 31/2808 324/750.19 |
| 2004/0178815 A1 | * | 9/2004 | Ou ..................... G01R 31/2806 324/750.25 |
| 2010/0019793 A1 | * | 1/2010 | Fossum .............. G01R 31/2808 324/763.01 |
| 2011/0084719 A1 | * | 4/2011 | Jiang .................. G01R 31/2808 324/754.13 |

* cited by examiner

*Primary Examiner* — Son Le  
(74) *Attorney, Agent, or Firm* — Altera Law Group, LLC

(57) ABSTRACT

A circuit board tester and method that precisely aligns the probe plate and circuit board is disclosed. With a circuit board and probe plate mounting within a housing having a top and bottom, hinged together, at closure there may be slight misalignments of the two. By making one of the two plates floating, or laterally slideable with respect to each other, it is possible to make final alignment at closure. One of the two plates can be provided with a pin and the other with a pin receiving alignment block. With the lateral slideability, the pin and block can insure proper probe alignment. Additional systems for correcting misaligned pins or blocks are also disclosed.

13 Claims, 12 Drawing Sheets

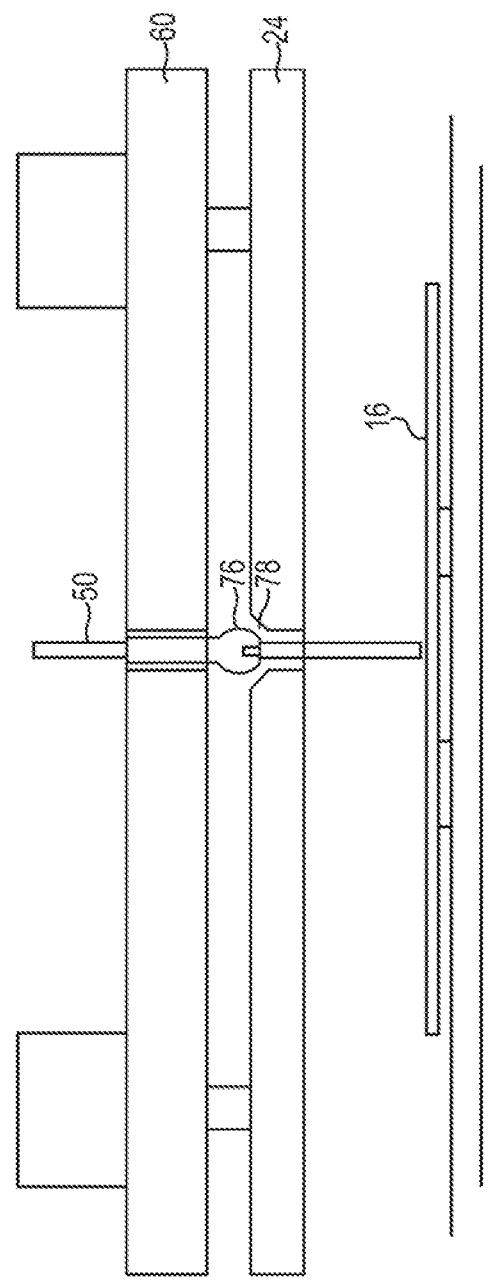
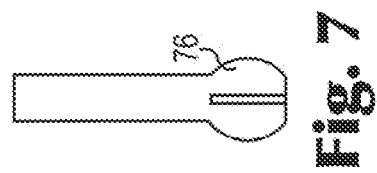

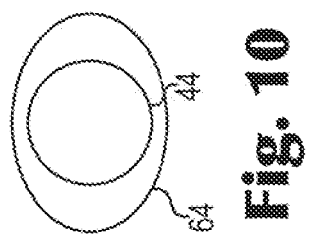
Fig. 10
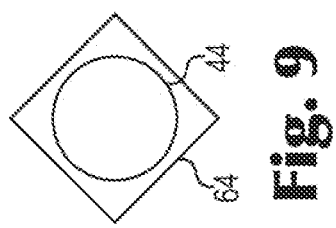
Fig. 9
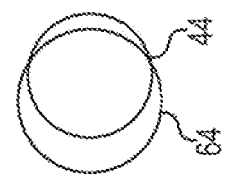
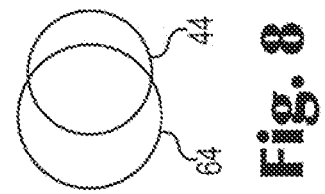
Fig. 8
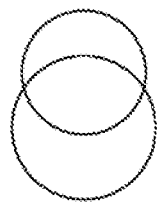

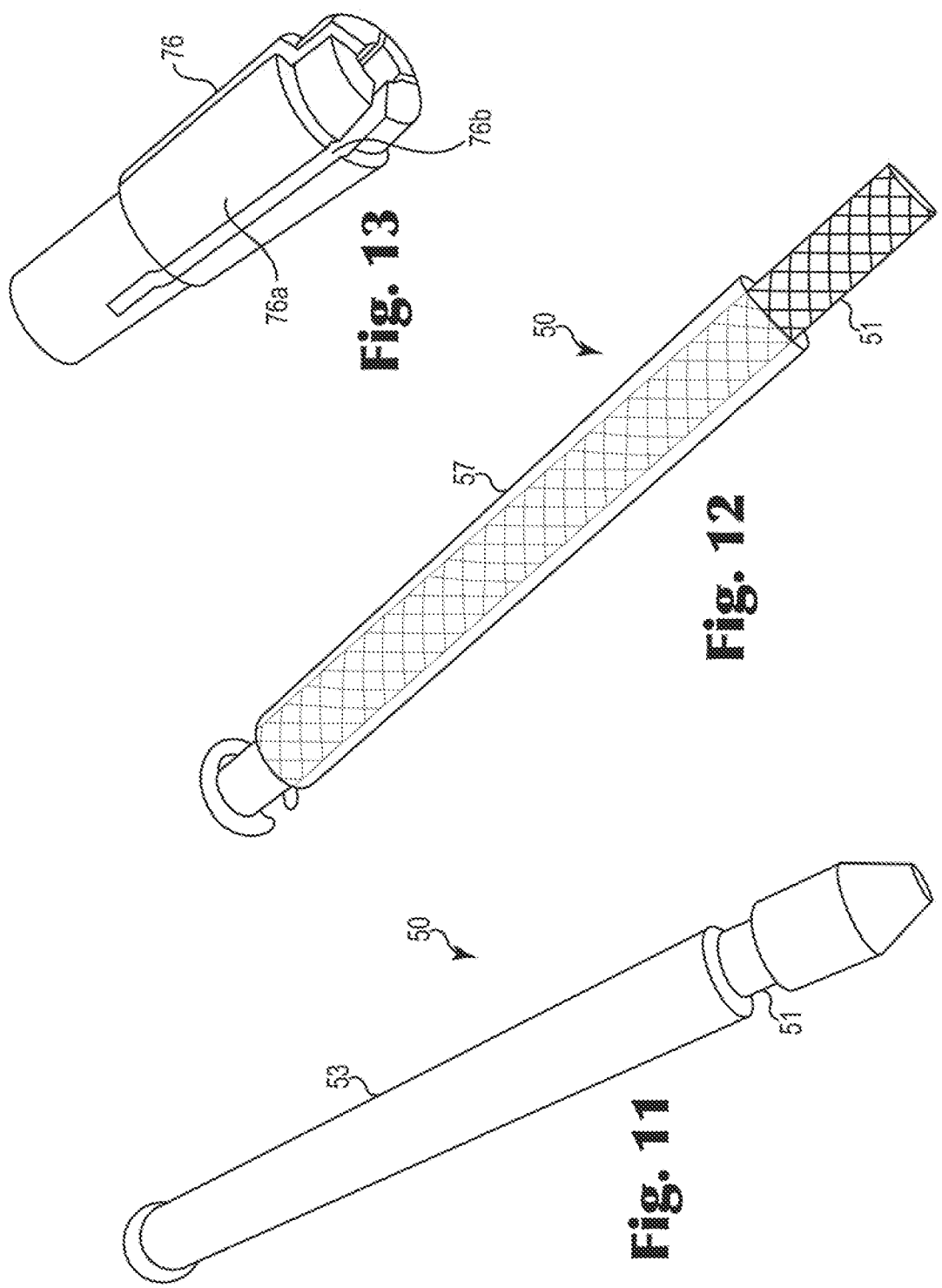

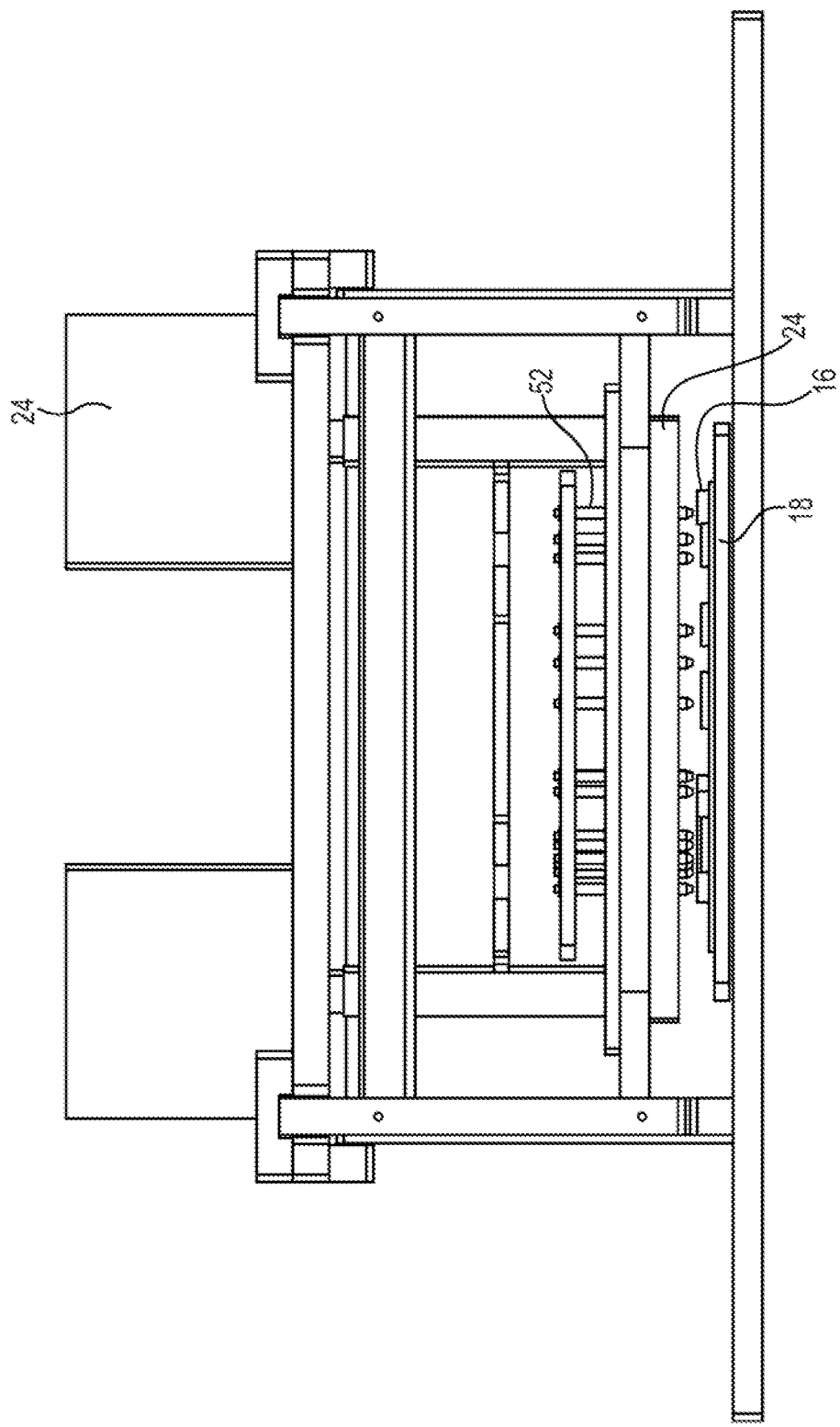

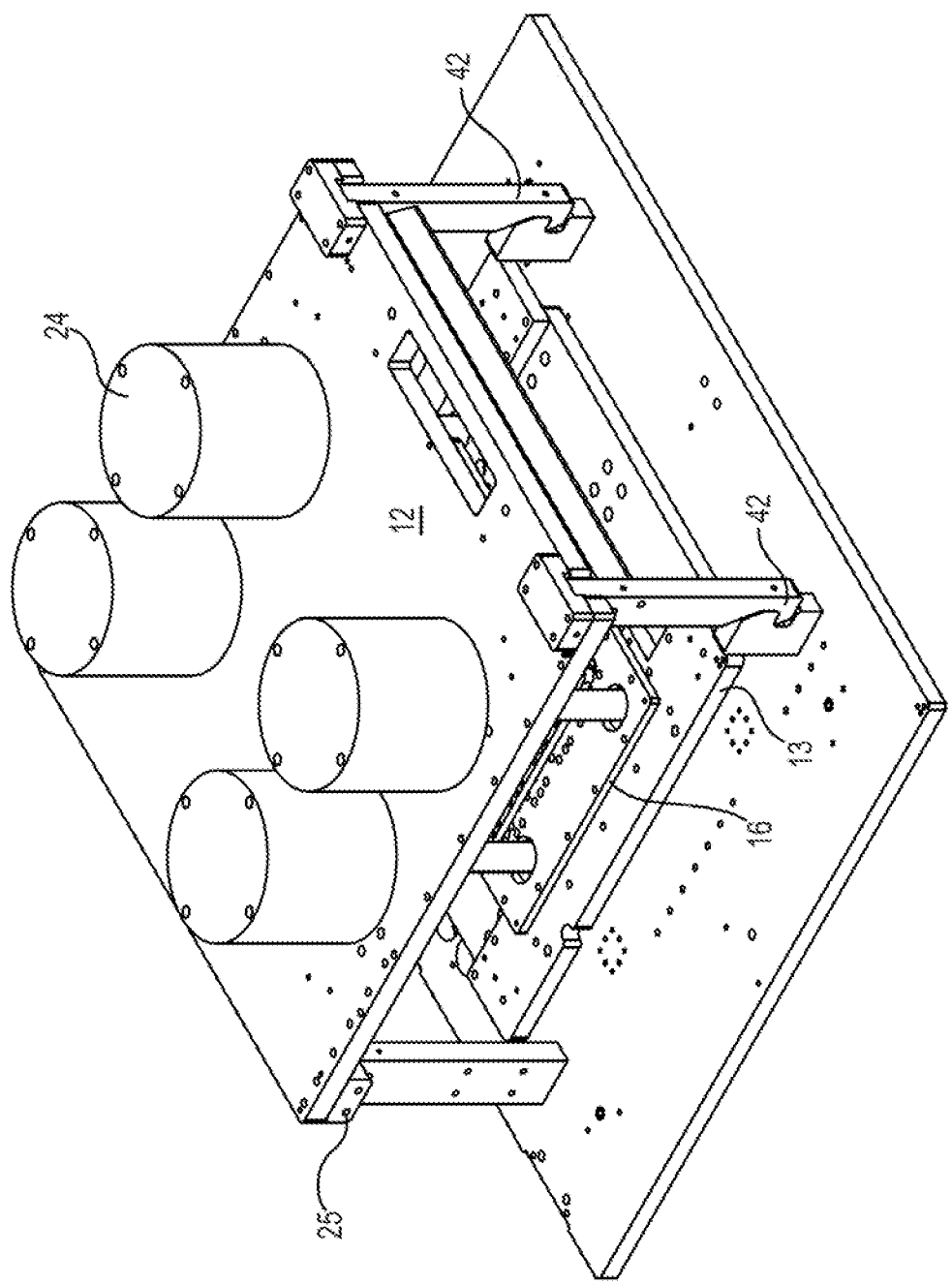

CIRCUIT BOARD TESTING DEVICE FOR UNEVEN CIRCUIT BOARDS

STATEMENT REGARDING FEDERALLY SPONSORED RESEARCH OR DEVELOPMENT

Not Applicable

BACKGROUND OF THE INVENTION

Field of the Invention

This invention is directed to test equipment, and more particularly to test equipment for circuit boards.

Description of the Related Art

Circuit board testers are used for testing a variety of circuit boards or similar devices to assure that the circuit boards operate as intended. In at least one type of circuit board tester, such as Agilent Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions that are contacted by the test or probes depend on the tests that are desired. When the probes are in contact with the desired locations on the circuit board, electrical signals with predetermined parameters (e.g., predetermined magnitudes or patterns of current, voltage frequency, phase and the like) are applied by the tester, typically under control of a computer, to certain of the probes. Some or all of the probes are used to measure the performance or response of the circuit board (i.e., to measure electrical parameters at some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests (and testing devices) for a variety of possible purposes (such as "spot checking" selected circuit boards at a production facility, testing circuit boards which may be malfunctioning, testing prototype circuit boards as part of a design program and the like), in at least some applications, circuit board testing is used to provide quality assurance on all or substantially all products of a given type or class which are produced by a company. Even with the relatively rapid test procedures which can be achieved by circuit testing, it is not unusual for desired testing of each circuit board to require on the order of 30 seconds to 90 seconds or more.

Because, in at least some applications, circuit board testing is performed on substantially all devices on a production line or production facility, reliability of testing can be especially important since delay or failure at a testing station can delay or interrupt the overall production in a production line or facility and cause expensive boards to be rejected. One cause of rejection or test failure is uneven or warped circuit boards.

Indeed, warped boards are quit common. The larger the board, the greater the likelihood that the board will not be sufficiently flat to conduct an accurate test. One reason why warped boards can fail a test, is that the warpage causes the probe to miss their target.

It as been assumed, that the solution to warped and uneven boards is to apply sufficient pressure on the board to even it out during test. This may work for minor warpage, but warpage of some degree will either damage the testing device by requiring so much pressure to make adequate probe contact or destroy the board. The board can be destroyed in this flattening process by snapping off surface mounted, galling the board, cracking ICs and other components, breaking leads, breaking traces or by other means which render the board unusable or untestable.

Accordingly, it would be useful to provide a fixture, useable in connection with in-circuit testers, which provides desired speed of positioning the circuit board or other unit under test (UUT) and which achieves a relatively high degree of reliability, and can test uneven boards without damage.

BRIEF SUMMARY

This summary is supplied to assist the reader in understanding the remaining disclosure and does not define of the scope of the invention.

The present disclosure relates to a system and method for insuring alignment of a probe plate with a unit under test (UUT) by bringing physical and electrical contacts into reliable and repeatable alignment even where the board (UUT) is not flat or warped. The disclosed feature can be added to existing circuit testing devices of almost any kind, so the disclosed testing device is only illustrative on one exemplary environment.

The following are some of the features of the disclosure.

There is disclosed a circuit tester for testing circuit boards having a housing; a first board mounting plate for receiving circuit board unit under test (UUT); a retaining plate associated with the second part of said housing, said retaining plate having a plurality of retaining fingers oriented toward the UUT, said retaining fingers being generally orthogonally slideable and lockable in said plate, said UUT and retaining plate being moveable toward each other, a locking plate for engaging said fingers and locking its orthogonal position relative to the retaining plate, so that when said UUT and retaining plate are brought toward each other during circuit test, said retaining fingers are allowed to engage the UUT at differing heights according to the flatness of the board, and wherein said fingers are then locked against the UUT by engaging said locking plate.

Also disclosed is a self adapting tester capable of adapting to test for testing a circuit board/unit under test (UUT) regardless of the board is planar, having a bed for receiving a UUT a push finger plate including a plurality of spaced apart apertures, a plurality of push fingers sized to be slideably received with in said apertures, a locking plate generally coplanar with said push finger plate said locking plate including a plurality of apertures generally collinearly aligned with said apertures in said push finger plate, a drive for moving one of said plates relative the other so that said plates have a first position where the apertures are generally collinearly aligned and second position where the apertures are partially out of alignment, so that the push fingers are capable of sliding generally orthogonally thru the plates when they are in the first position and are locked from sliding when the plates are in the second position, so that pressure is generally applied equally across the UUT by the push fingers when they are allowed to contact the UUT in the first position and locked in the second position.

Also disclosed is a tester wherein the apertures, when collinearly aligned are equal to or greater than the diameter of the fingers and when not collinearly aligned are less than the finger diameter.

Also disclosed is a tester wherein the apertures on one of the plates are non-round.

Also disclosed is a tester wherein the locking plate moves laterally and the finger plate is laterally static.

Also disclosed is a tester, wherein the fingers include a barrel portion and wherein at least a portion of the barrel passes through the apertures and where that portion includes an area of increased friction.

Also disclosed is a tester, wherein said area of increased friction includes a knurled portion.

Also disclosed is a tester, wherein said area of increased friction includes a high friction coating.

Also disclosed is a tester, wherein the push fingers include a central core pin and a collet surrounding said pin and wherein said core pin is locked by compression of the collet.

Also disclosed is a tester, where said fingers include an actuator which extends and retracts the length of the finger in response to force applied.

Also disclosed is a tester, wherein the force is selected from the group of: pneumatic, hydraulic, electric or electromagnetic forces.

Also disclosed is a tester, wherein said fingers further include a stop at their end most proximate finger plate, said stop configured to prevent the pin from passing completely thru the plate.

Also disclosed is a tester for testcircuit boards having a housing; a first board mounting plate for receiving circuit board/unit under test (UUT); a retaining plate associated with the second part of said housing, said retaining plate having a plurality of retaining fingers oriented toward the UUT, said retaining fingers being generally orthogonally slideable and lockable in said plate, said UUT and retaining plate being moveable toward each other, a locking plate for engaging said fingers and locking its orthogonal position relative to the retaining plate, so that when said UUT and retaining plate are brought toward each other during circuit test, said retaining fingers are allowed to engage the UUT at differing heights according to the flatness of the board, and wherein said fingers are then locked against the UUT by engaging said locking plate.

Also disclosed is a tester, for testing circuit boards having a housing; a first board mounting plate for receiving circuit board/unit under test (UUT); a retaining plate associated with the second part of said housing, said retaining plate having a plurality of retaining fingers oriented toward the UUT, said retaining fingers being generally orthogonally disposed in said plate and having an actuator for extending and retracting their length, said UUT and retaining plate being moveable toward each other, so that when said UUT and retaining plate are brought toward each other during circuit test, said retaining fingers are actuated to contact said UUT at differing heights according to the flatness of the board, and wherein said fingers are then locked against the UUT by engaging locking the actuator against further length change of the fingers.

There is also disclosed a method of circuit testing of a circuit board/united under test (UUT) in a circuit tester having a UUT moveable retaining plate having a plurality of retaining fingers slideably extending toward the UUT comprising the steps of:
  a. bringing the fingers of the retaining plate in contact with the UUT;
  b. allowing the fingers to slide generally orthogonally in the retaining plate until they contact the UUT;
  c. locking the fingers from sliding relative to the retaining plate;
  d. conducting electrical tests of the UUT.

Also disclosed is a method of precisely applying pressure on a UUT with a probe plate having a plurality of vertically actuatable locking pressure fingers, comprising the steps of:
  mounting the UUT on either side of a hingeable housing;
  mounting a probe plate with said pressure fingers on the other side of the hingeable housing;
  providing actuatable engagement of either the probe plate or UUT with respect to its side of the housing to bring the probe plate and fingers in contact;
  adjusting the length of the fingers so that each engages the UUT regardless of the surface height of the UUT at each point of contact;
  locking the position of the fingers to prevent further movement thereof; moving the UUT and probe plate into closer contact according to a predetermined desired test position. The fingers may apply different pressure in different points on the board.

BRIEF DESCRIPTION OF THE SEVERAL VIEWS OF THE DRAWINGS

FIG. 6 illustrates an alternative embodiment with a collet-style locking finger;

FIG. 7 is a close up view of the collet-style locking finger;

FIG. 8 is a schematic top view of retention and locking plate hole alignment;

FIG. 9 is a schematic top view of retention and locking plate hole where the locking plate hole is diamond shape;

FIG. 10 is a schematic top view of retention and locking plate hole where the locking plate hole is oval or has taper ends;

FIG. 11 is a perspective view of a pin/finger assembly;

FIG. 12 is a perspective view of an alternate pin/finger assembly;

FIG. 13 is a perspective view of a collet in useable with a central shaft as an alternative to the above pin assembly;

FIG. 14 is a side plan view of FIG. 3;

FIG. 15 is a side perspective view of FIG. 3;

DETAILED DESCRIPTION

In a manufacturing environment for circuit boards, a final test will often be an electrical test, to ensure that each circuit board performs as required. Such tests are well-known in the industry, and may be performed by commercially available testers, such as Agilent Model 3070. Many boards are not flat. They may be warped or they may intentionally non-planar to fit enclosure requirements. This disclosure provides solutions which make testing of non-planar boards possible.

Figure 1:
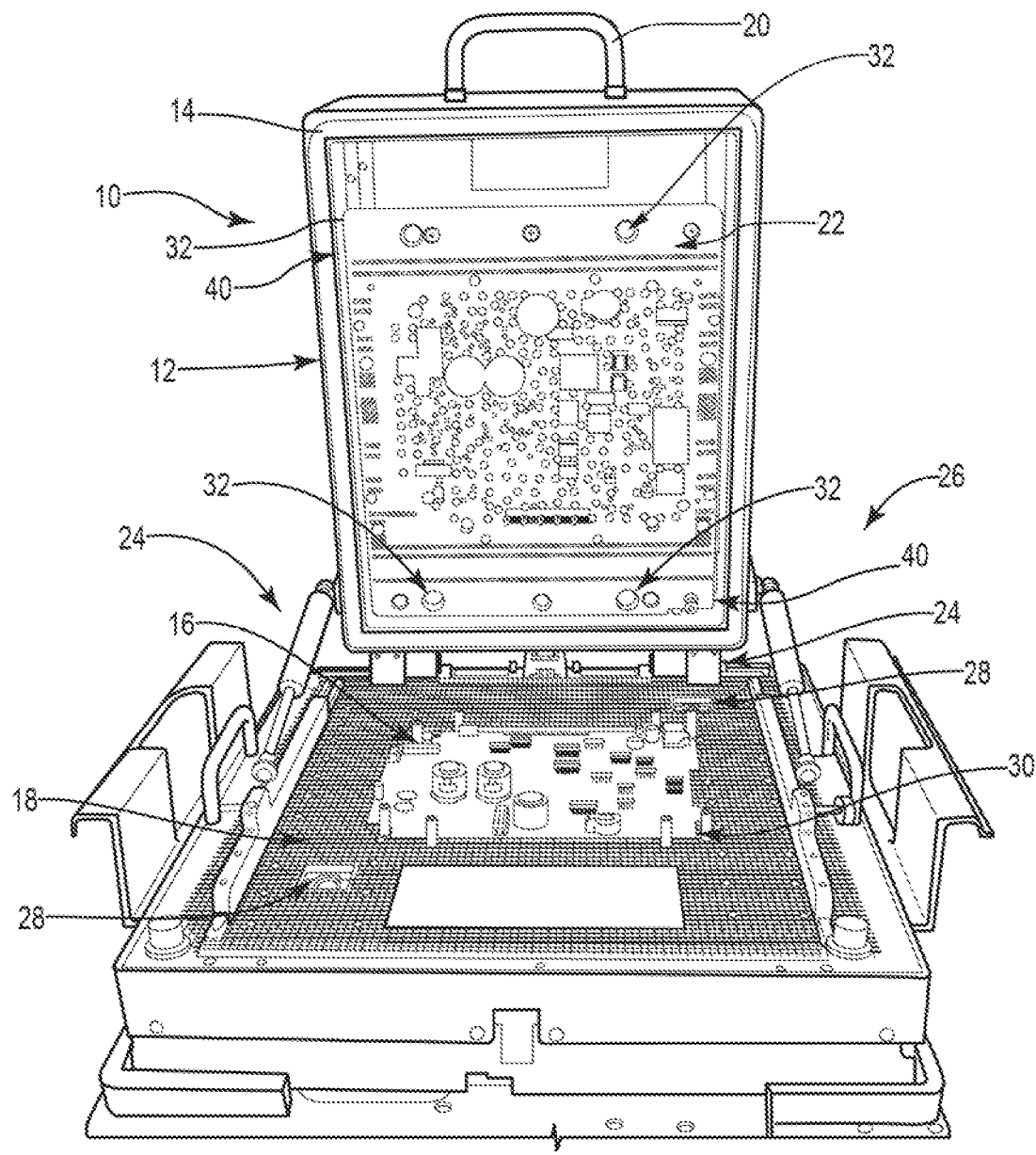
FIG. 1 is a perspective view of a circuit board tester from U.S. Pat. No. 8,004,300 in open position as an environmental view.

A detailed view of the mechanical configuration is shown in FIG. 1, a prior art system described in U.S. Pat. No. 8,004,300 incorporated by reference and shows a testing environment. The UUT (unit under test) is shown as a circuit board 16 and is removably and rigidly attached to, and optionally, spaced apart from, a support plate or mounting plate 18 with or without spacer elements. In this configuration, the electrical contacts on the UUT 16 that are to be tested face upward, and are accessible to various probes from above or below plate 18. There may also be probes from underneath the UUT 16. In this case, probes from the top are illustrated. Note that the circuit board and fixture on which it is mounted are considered one for the purpose of this application, though they are likely to be separate components. We refer to the circuit board whether or not it includes a fixture. The probes may apply and measure voltages or currents at various locations on the UUT, and are controlled mechanically and electrically by the tester. A computer, not shown, may control the tester and may record data from the tests.

The testing system 10 is shown as a box with a top 12 with handle 20 holding a probe plate 22. Probe plate 22 is configured to be freely moveable in lateral directions and optionally to a limited degree along a vertical axis which passes orthogonally thru the UUT 16 which sites on a "bed" in the bottom portion of the box, and contacted by the probe plate 22 when the box is closed and actuated as will be explained. On the probe plate are of course electrical probes, but also a plurality of pins or retaining or push fingers which engage the UUT to hold it in place during the test. In prior art systems, it is these pins/fingers which can damage a warped board because they are fixed in length and apply pressure to the UUT unevenly when the UUT is uneven. If for example the UUT has a high portion, the fingers will effectively try to crush the board into a flat plane. This is highly undesirable and can destroy or even pierce the board or snap off components.

The bottom of the system 10 includes a support plate 18 which supports the UUT 16 preferably rigidly in place on plate 18. There are several ways to accomplish this rigid connection. The preferred way is by posts 30 which surround the UUT and create a rigid perimeter. The posts may engage notches in the UUT board, but they may also simply be placed around the periphery to inhibit movement. In some circumstances, the UUT may have existing apertures which allow it to be affixed to the support plate.

Hinges 25 allow the top 12 and support 18 to move relative to each other. Pneumatic cylinders 24, regulate the movement of the top and plate.

In may cases the circuit board (UUT) is not perfectly flat. As previously mentioned unevenness or warpage creates serious problems with reliable contacting of probes on the UUT, which are compounded in dual stage for bi-level systems which have short and long probes for in-circuit and functional tests. Warped boards create misalignment and incorrect pressure application in the Z-axis. Other methods devised for misalignment the X-Y axes do not address Z-axis misalignment and pressure issues.

Figure 2:
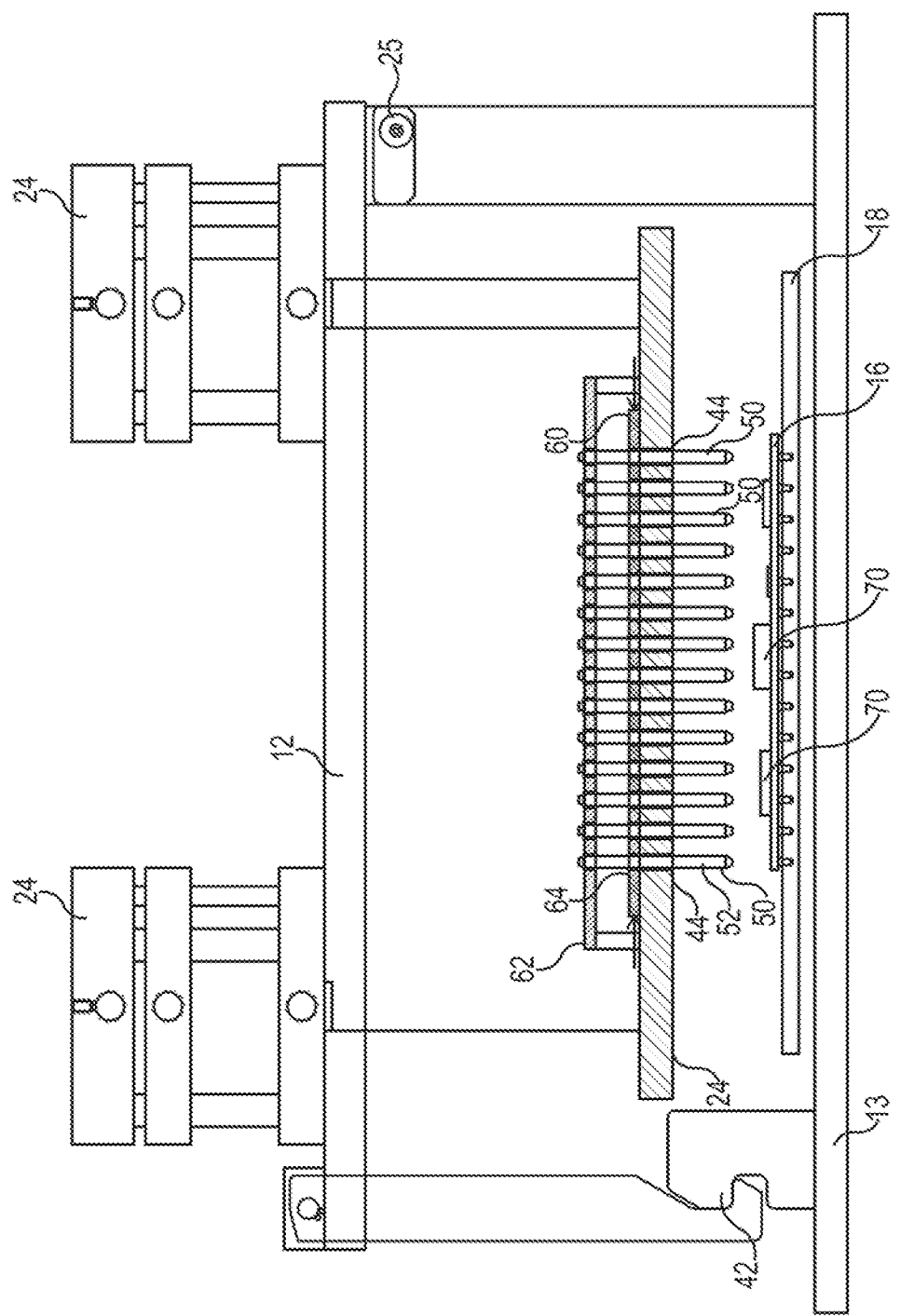
FIG. 2 illustrates a schematic side view of a circuit board tester in rest, first stage.

FIG. 2 illustrate schematically a testing device modified to include the new disclosure and concepts. Hinge 24 provides a pivot for the top portion 12 to engage the bottom portion 13. A latch system 42 is shown but alternative latches are suitable.

FIG. 2 shows the system in a "rest" state, ie not in test mode. Probe plate 24 (also known as a jumper plate) contains a plurality of holes 44 through which push down pins/retainer/push fingers 50 are freely slideable. This means that the holes are at least slightly larger than the diameter of the pins 50.

Pins/Fingers 50 are cylindrical rods of a rigid material like steel or plastic. A close up view is found in FIG. 5. Resilient materials may also be used. The preferred embodiment has the rigid material covered by a more compressible or higher friction sleeve 52. One such material is a compressible plastic or a knurling on the rigid surface to create a high friction surface. These embodiments help in creating frictional engagement when the pins/fingers are locked against sliding movement.

At the distal end of each finder is preferably a tapered section 54 with a flat end. The taper reduces the contact area which is advantageous for crowded boards. The taper and be much more pointed but should preferably not have a sharp end. Stop or end cap 58 prevents the finger from sliding entirely thru the board.

At the proximal end, the pin includes a retainer which may be any number of elements which enlarge the end to prevent the pin from falling out. A circlip retainer is suitable as would be a bulbus end.

Relatively adjacent the jumper plate 24 is a second moveable laterally sliding plate 60 and a fixed retainer plate 62. The sliding plate 60 has a plurality of holes similar spaced in the same pattern as holes 44 in plate 24 but of greater diameter. This increased diameter allows the plate 60 to slide laterally in parallel with plate 24 but in its neutral position (shown in FIG. 2.) not engage the pins/fingers 50. The plates are preferably generally coplanar and then moved relative to each other, ie plate 60 (or plate 24) is moved laterally by a drive preferably having remote actuation (electrical/mechanical/pneumatic) or manual drive lever so that the holes in one plate and the holes in the other impinge/pinch upon the pin/finger preventing their movement. If the plates are not coplanar, the apertures need to be larger to accommodate the pins in their aligned position.

Figure 3:
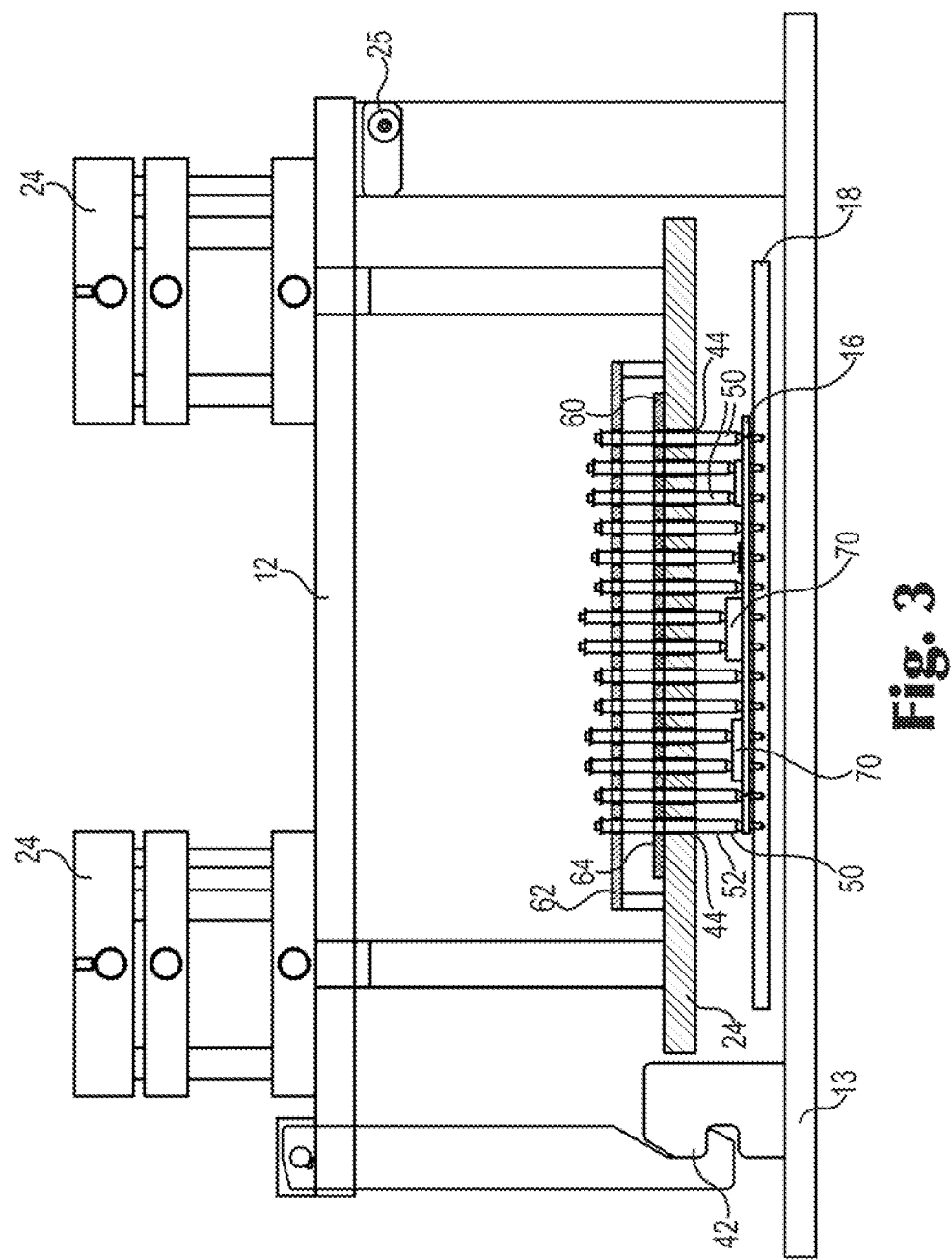
FIG. 3 illustrates a schematic side view of a circuit board tester in a second stage where the fingers first engage the UUT.

FIG. 3 shows the system in the engagement (first) stage where the push fingers 50 engage various points on the UUT 16 after having moved toward the UUT along the Z-axis. The unevenness of the board can be caused by the board itself or by components thereon. The board is shown as flat but the components supply an example of unevenness. (Most often the fingers are placed between components but component contact cannot always be provided on densely populated boards. Warpage is not easily shown in the drawings but can be presumed to exist on many boards. Notice that whether by warpage or components, the fingers adjust to the actual height of that portion of the board. No attempt is made via the fingers to flatten the board. They simply conform to the curvature of the board. The fingers are free to rise or fall under the force of gravity to their equilibrium position. FIGS. 14, 15, 16, and 17 provide additional views to understand the entire system in various views.

Figures 4, 5:
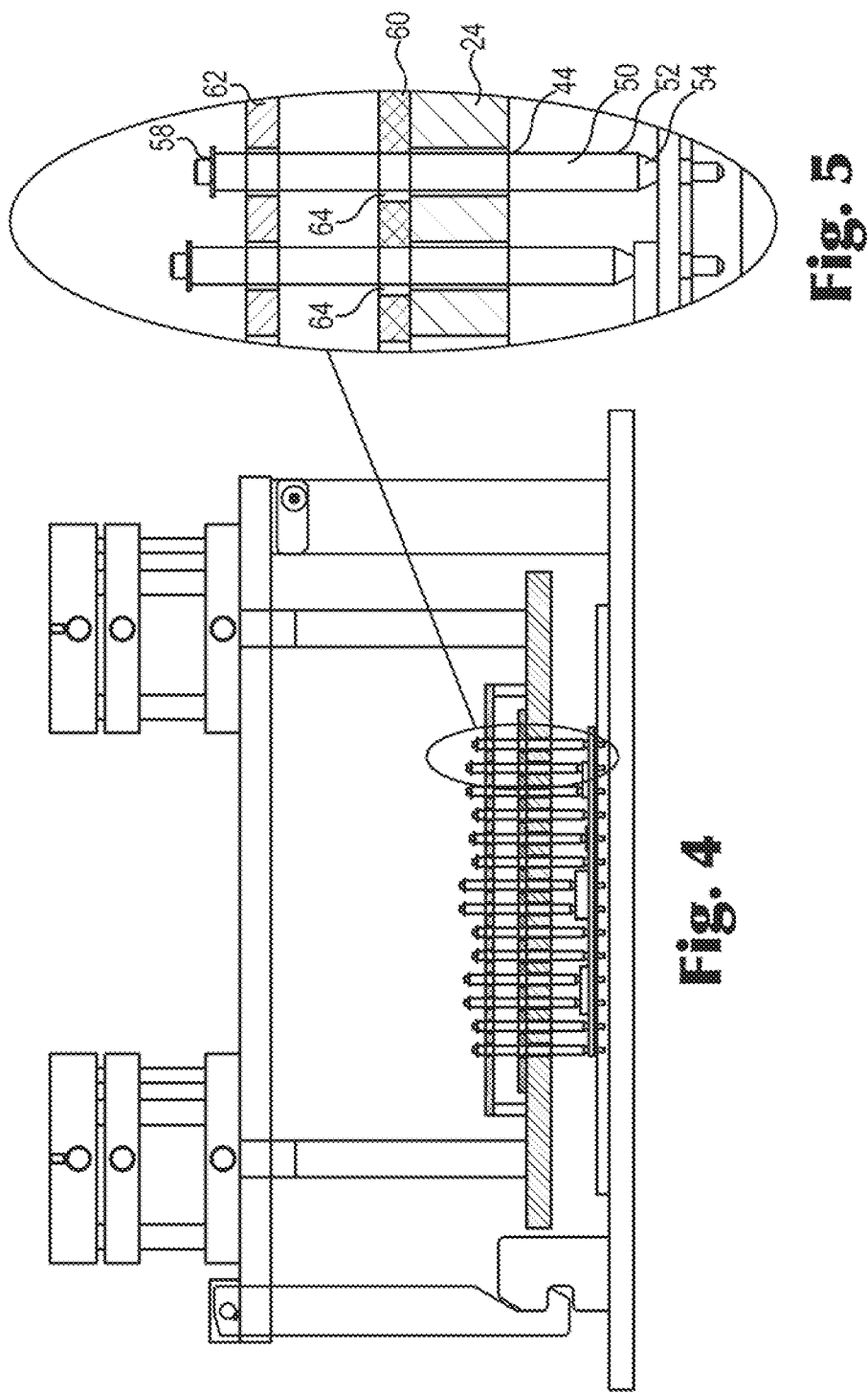
FIG. 4 illustrates a schematic side view of a circuit board tester in a third, test stage position with fingers locked.
FIG. 5 is a fragmentary enlarged view of a portion of FIG. 4 showing fingers in a locked state.
Figure 16:
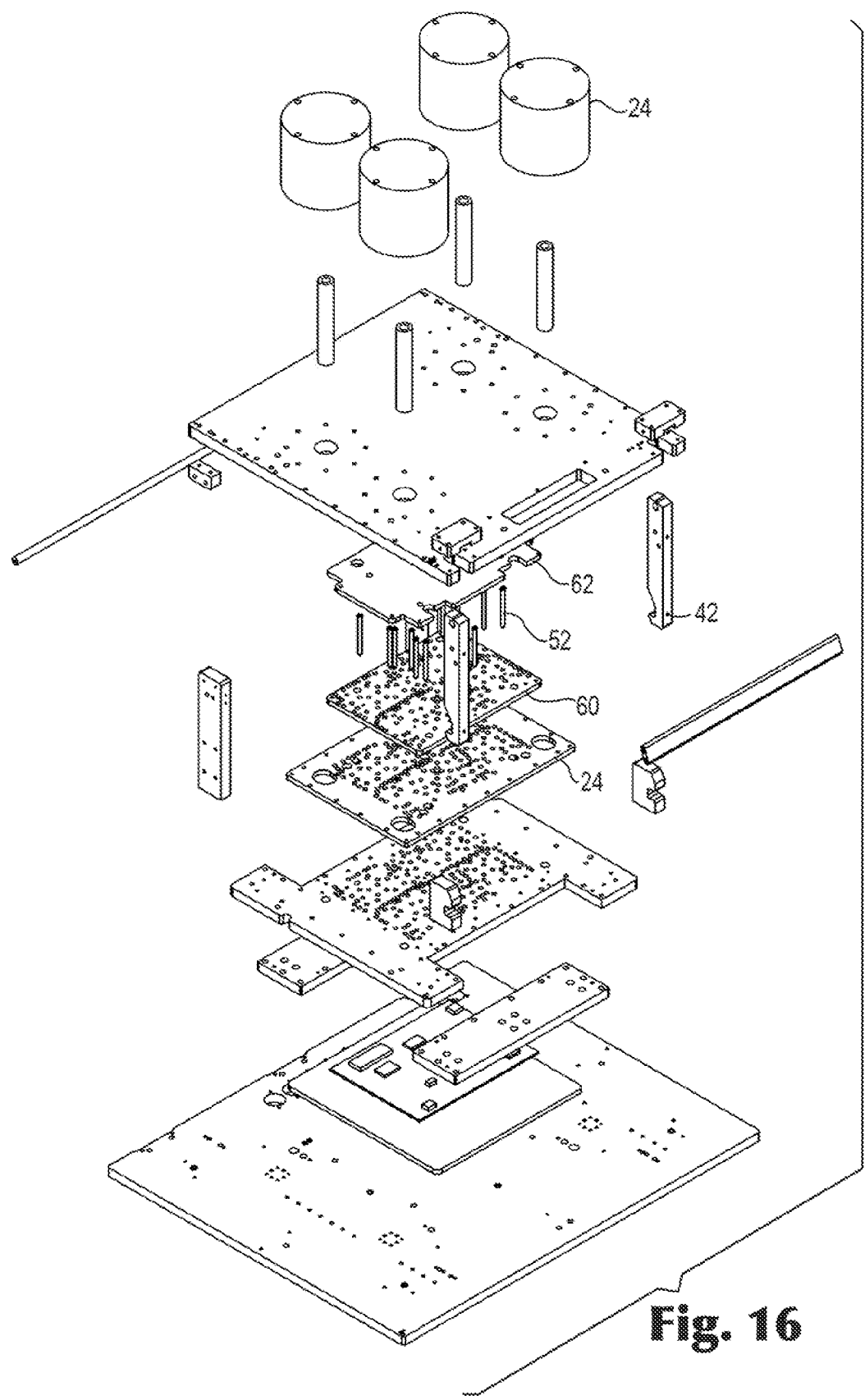
FIG. 16 is an exploded perspective view from above of FIG. 15.
Figure 17:
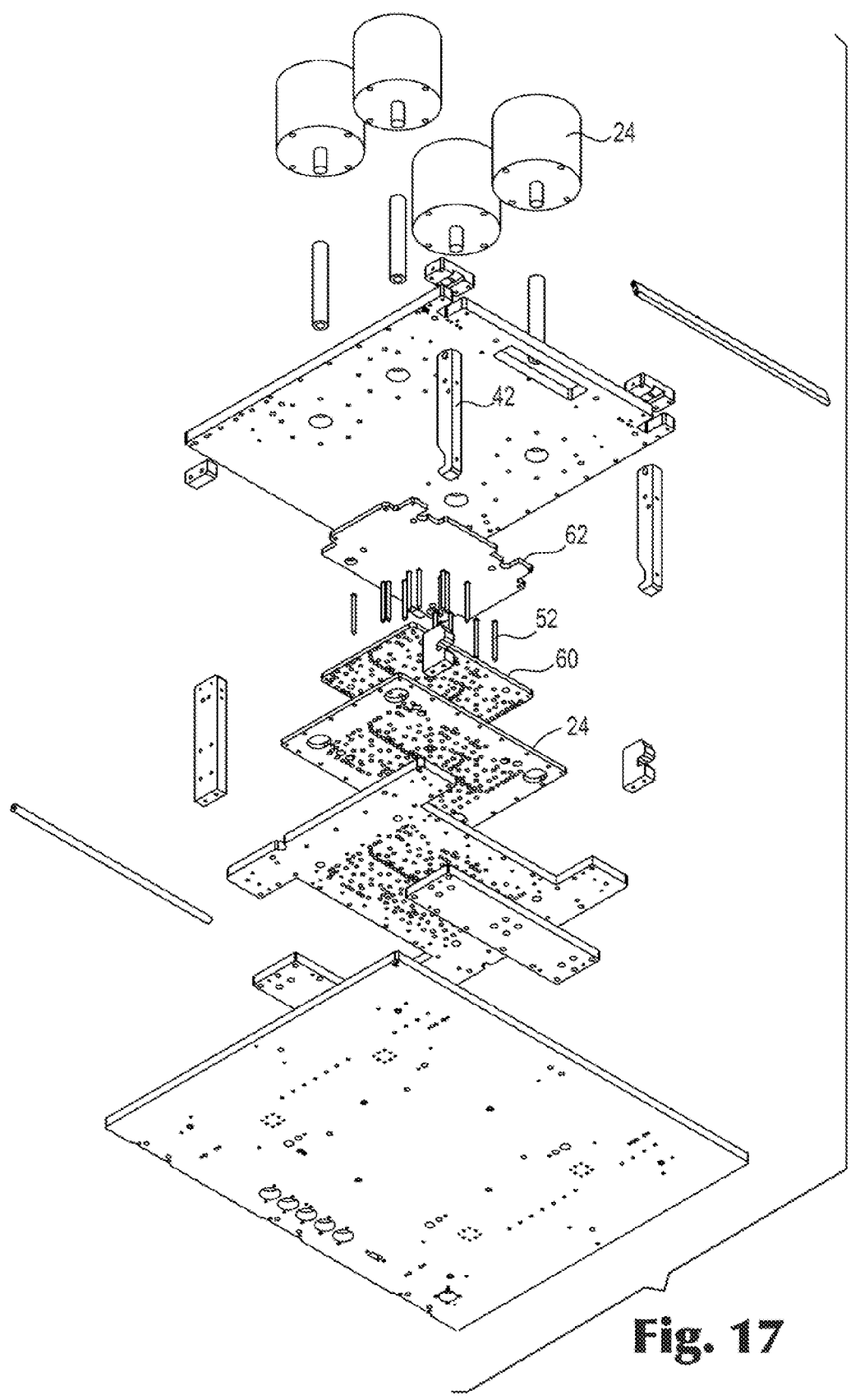
FIG. 17 is an exploded perspective view from below of FIG. 15.

FIGS. 4-5 show the UUT in test stage. The probe/jumper plate 24 is in test position (probes are not shown) but now the fingers 50 are locked into place. Sliding plate 60 has moved relative to jumper plate 24 so the combined diameter/area of the holes is less than or equal to the outer peripheral diameter of the shaft of the pins 50. In essence, the pins are trapped/locked between the opposing lateral forces of the two plates 24-60, so that they can no longer move longitudinally, ie generally orthogonally to the holes. The UUT is thus engaged in its position, accommodating for unevenness and warpage. Components are not overstressed by an attempt to reshape the board.

FIGS. 6 and 7 illustrate an alternative locking system. Instead of friction engagement with the shaft of the pin by the edges of the holes 60 and 44, it is possible to utilize a collet 76 in the hole and have the other plate with holes compress the collet around a core pin (not shown) with vertical instead of lateral movement to compress the collet. FIG. 6 shows plate 24 with a recessed depression 78 sized to receive the compressible part of the collet 76. See also FIG. 13 which shows the collet in close up perspective with a compressible portion 76a and a plurality a slots 76b spaced around to allow for compression. Plate 60 is slide downward to drive the collet 76 in the recess 78. This compresses the collet around the finger shaft 50 locking it against sliding in the collet and thus maintaining its position relative to the UUT. The recess 78 is shown as V-shaped but may be other shapes configured to cause the collet to compress, such as a bulbous shape or a cylindrical recess.

FIG. 8 is a schematic top view of the two plates 24 and 60 shown with their respective holes 44 and 64 intentionally misaligned to show the reduction in the composite hole diameter which locks the pin 50. FIGS. 9 and 10 show alternative embodiments where one of the plates preferably, the upper plate 60 has a non-circular opening that tapers to one or both ends. Ovals, diamonds, triangles, etc, meet these characteristics. By sliding the plate with tapered apertures toward the aperture, the pin or collet is thereby locked. The locking/pinching action can be achieve so long as the resultant diameter of the collinearly aligned apertures is less than the diameter of the finger when the apertures are move out of collinear alignment. One solution is that the apertures in on plate are not round or have sides with a lesser cross section or diameter.

FIG. 11 is a close up view of a preferred pin 50 with a tapered tip, a shaft 51 and a slightly compressible overlay 53 which in this case is a plastic sheath. FIG. 12 is similar (with tapered end removed) but has a knurled surface 51 on it shaft. This may be useful in holding the sheath 53 in place, or the sheath may be dispensed with as the knurled body is sufficiently high friction to engage the holes 44 and 60 in a locked state. The shaft should in the preferred embodiment be de-burred or even smooth to prevent hanging on a hole and not traveling freely in response to gravity. To remove the risk of hanging on pins, the board can be vibrated during movement or the pins can be driven down onto the UUT independently of the plate's movement. This could be down by an air jet, a separate backing board which has a resilient surfaces (such as foam) and which drives the pins downward or by mechanical, electrical, or pneumatic systems.

In certain conditions, it may be desirable to apply greater pressure on the board/uut than has been described. This can be accomplished by the method as described with locking of the pins/fingers, but then after the pins are locked in position, driving the pins (and associated probes slightly further toward the UUT. This will increase the overall pressure on the UUT but it will still be even pressure, ie take into account the unevenness of the board. In such a way, the pressure can be uniformly increased without risk of damage to the UUT.

Figure 18:
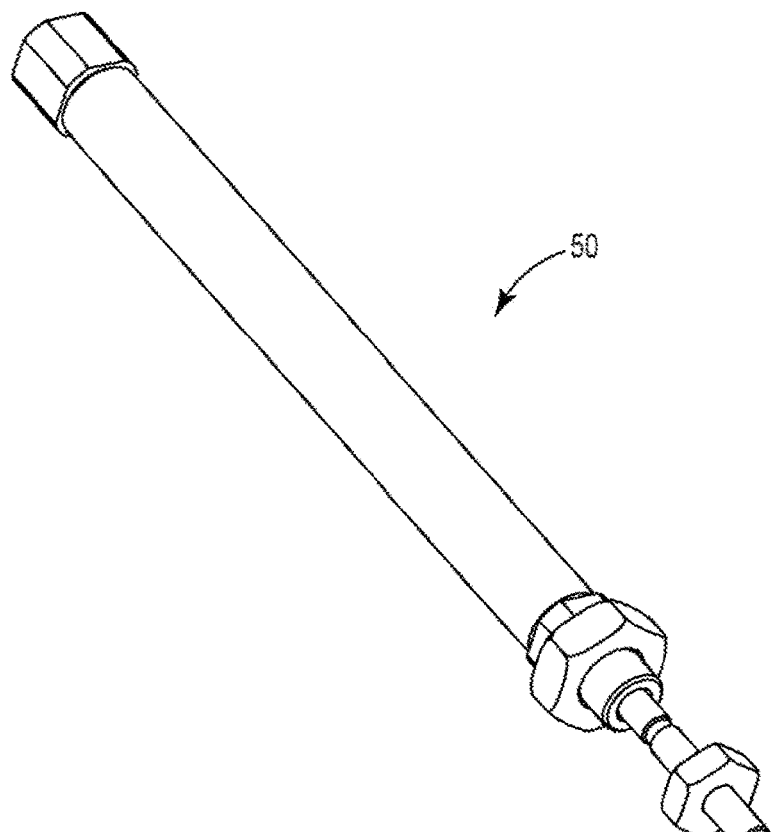
FIG. 18 is a view of an actuatable push finger.

Alternative to the gravity fed fingers 50 are contemplated by this invention. FIG. 18 is a view of an actuatable push finger. Finger 50 can include a drive cylinder (electrical, solenoid, hydraulic, pneumatic, etc.) which has a first fixed portion which is attached to one of the plates, (62 for example) and a distal portion which slides relative to the fixed portion, in response to force, such as fluid, magnet force, etc. Hydraulic/solenoid cylinders are know in the art in other fields such a fuel injectors (for example hydraulic cylinders from Custom Cylinders Inc. 700 Industrial Dr, Cary, Il 60013 or solenoids such as in US patent publication US 2005/0103882). So instead of using gravity to allow the fingers to drop into place, a force drives an extension of a pin onto the UUT. The advantage of a 'force driven" or "powered" finger array is that it is position independent. Therefore, it is possible to have the fingers project upward (such as from the bottom) or sideways. This may also eliminate finger "hanging" and likewise eliminates the need to a locking plate if desired, because the force applied can be maintained or released remotely and each finger could be controlled independently by a pressure lock value or electronic control. Different forces could be applied to each finger independently so greater or less forces could be applied to fingers touching the base circuit board rather than delicate components.

Thus, a tester built with fingers which are actuatable (ie have an actuator, perhaps internal, such as a solenoid or pneumatic/hydraulic cylinder) could have a housing; a first board mounting plate for receiving circuit board/unit under test (UUT); a retaining plate associated with the second part of said housing, said retaining plate having a plurality of retaining fingers oriented toward the UUT, said retaining fingers being generally orthogonally disposed in said plate and having an actuator for extending and retracting their length, said UUT and retaining plate being moveable toward each other, so that when said UUT and retaining plate are brought toward each other during circuit test, said retaining fingers are actuated to contact said UUT at differing heights according to the flatness of the board, and wherein said fingers are then locked against the UUT by engaging locking the actuator against further length change of the fingers.

Likewise a method of testing a UUT with an actuatable finger will actuate the fingers to contact the UUT at varying contact heights and then the actuator will be locked so that the finger length is then fixed during test. It is likewise possible to also have the actuator increase the pressure after contact to a predetermined level, or have certain fingers have a greater level of pressure, such as those which extend the longest or past a predetermined length, which might indicate they are situated on the board not a more fragile circuit component. It is also possible to use this actuatable finger concept to apply selective pressure on the board to flatten it, though that may be desirable only in certain circumstances.

The description of the invention and its applications as set forth herein is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. A circuit tester for testing circuit boards having a housing; a first board mounting plate for receiving circuit board/unit under test (UUT); a retaining plate associated with a second part of said housing, said retaining plate having a plurality of retaining fingers oriented toward the UUT, said retaining fingers being generally orthogonally disposed in said plate and having an actuator for extending and retracting their length, said UUT and retaining plate being moveable toward each other, so that when said UUT and retaining plate are brought toward each other during circuit test, said retaining fingers are actuated to contact said UUT at differing heights according to the flatness of the board, and wherein said fingers are then locked against the UUT by engaging locking the actuator against further length change of the fingers and including a lock for locking said retaining fingers from sliding generally orthogonally toward the plates when they are in the locked position.

2. The tester of claim 1 wherein the apertures, when collinearly aligned are equal to or greater than the diameter of the fingers and when not collinearly aligned are less than the finger diameter.

3. The tester of claim 1 wherein the apertures on one of the plates are non-round.

4. The tester of claim 1 wherein the locking plate moves laterally and the finger plate is laterally static.

5. The tester of claim 1 wherein the fingers include a barrel portion and wherein at least a portion of the barrel passes through the apertures and where that portion includes an area of increased friction.

6. The tester of claim 1 wherein said area of increased friction includes a knurled portion.

7. The tester of claim 1 wherein said area of increased friction includes a high friction coating.

8. The tester of claim 1 wherein said push fingers include a central core pin and a collet surrounding said pin and wherein said core pin is locked by compression of the collet.

9. The tester of claim 1 where said fingers include an actuator which extends and retracts the length of the finger in response to force applied.

10. The tester of claim 9 wherein the force is selected from the group of: pneumatic, hydraulic, electric or electromagnetic forces.

11. The tester of claim 1 wherein said fingers further include a stop at their end most proximate finger plate, said stop configured to prevent the pin from passing completely thru the plate.

12. A circuit tester for testing circuit boards having a housing; a first board mounting plate for receiving circuit board/unit under test (UUT); a retaining plate associated with a second part of said housing, said retaining plate having a plurality of retaining fingers oriented toward the UUT, said retaining fingers being generally orthogonally disposed in said plate and having an actuator for extending and retracting their length, said UUT and retaining plate being moveable toward each other, so that when said UUT and retaining plate are brought toward each other during circuit test, said retaining fingers are actuated to contact said UUT at differing heights according to the flatness of the board, and wherein said fingers are then locked against the UUT by engaging locking the actuator against further length change of the fingers.

13. A circuit tester for testing circuit boards having a housing; a first board mounting plate for receiving circuit board/unit under test (UUT); a retaining plate associated with a second part of said housing, said retaining plate having a plurality of retaining fingers oriented toward the UUT, said retaining fingers being generally orthogonally slideable and lockable in said plate, said UUT and retaining plate being moveable toward each other, a locking plate for engaging said fingers and locking its orthogonal position relative to the retaining plate, so that when said UUT and retaining plate are brought toward each other during circuit test, said retaining fingers are allowed to engage the UUT at differing heights according to the flatness of the board, and wherein said fingers are then locked against the UUT by engaging said locking plate.

* * * * *